US009590169B2

(12) United States Patent
Ishida et al.

(10) Patent No.: US 9,590,169 B2
(45) Date of Patent: Mar. 7, 2017

(54) DRIVE DEVICE, LENS MODULE, AND IMAGE PICKUP UNIT

(75) Inventors: Takehisa Ishida, Tokyo (JP);
Nobuyuki Nagai, Kanagawa (JP);
Yusaku Kato, Tokyo (JP)

(73) Assignee: Dexterials Corporation, Tokyo (JP)

( * ) Notice: Subject to any disclaimer, the term of this patent is extended or adjusted under 35 U.S.C. 154(b) by 177 days.

(21) Appl. No.: 14/234,841

(22) PCT Filed: Aug. 2, 2012

(86) PCT No.: PCT/JP2012/069679
§ 371 (c)(1),
(2), (4) Date: Jan. 24, 2014

(87) PCT Pub. No.: WO2013/021903
PCT Pub. Date: Feb. 14, 2013

(65) Prior Publication Data
US 2014/0168504 A1     Jun. 19, 2014

(30) Foreign Application Priority Data
Aug. 11, 2011   (JP) .................................. 2011-175616

(51) Int. Cl.
*H02N 11/00* (2006.01)
*H01L 41/193* (2006.01)
(Continued)

(52) U.S. Cl.
CPC .............. *H01L 41/193* (2013.01); *G02B 7/04* (2013.01); *G02B 7/102* (2013.01); *G03B 3/10* (2013.01);
(Continued)

(58) Field of Classification Search
CPC .......... G21H 1/00; G21H 1/02; H02N 11/002; H02N 11/006; F03G 7/005; H04R 23/00; H01G 9/22
(Continued)

(56) References Cited

U.S. PATENT DOCUMENTS 5,268,082 A     12/1993 Oguro et al.
7,917,027 B2 *   3/2011 Nakayama et al. .......... 396/261
(Continued)

FOREIGN PATENT DOCUMENTS

CN     101847941 A     9/2010
CN     101893747 A     11/2010
(Continued)

OTHER PUBLICATIONS

Chinese Office Action for Chinese Application No. 201280037196.0 issued Aug. 5, 2016.
Japanese Office Action for Japanese Application No. 2011-175616 issued Sep. 6, 2016.

*Primary Examiner* — Thomas Dougherty
(74) *Attorney, Agent, or Firm* — Wolf, Greenfield & Sacks, P.C.

(57) ABSTRACT

There are provided a drive device and the like that are capable of suppressing characteristic degradation according to ambient environment. The drive device includes one or a plurality of polymer actuator devices each configured using an ion-exchange resin, and the ion-exchange resin contains operating ions that have activation energy equal to or smaller than a predetermined threshold. Degradation in ion conductivity in the ion-exchange resin is suppressed even in environment with low humidity, high temperature, and the like.

19 Claims, 11 Drawing Sheets

(51) Int. Cl.
*G02B 7/10* (2006.01)
*G03B 3/10* (2006.01)
*G02B 7/04* (2006.01)
*H01L 41/09* (2006.01)
*G03B 5/00* (2006.01)

(52) U.S. Cl.
CPC ............... *G03B 5/00* (2013.01); *H01L 41/09* (2013.01); *G03B 2205/0046* (2013.01); *G03B 2205/0084* (2013.01)

(58) Field of Classification Search
USPC .......................................... 310/800, 300–371
See application file for complete search history.

(56) References Cited

U.S. PATENT DOCUMENTS

| | | | |
|---|---|---|---|
| 7,982,368 B2* | 7/2011 | Takahashi | 310/330 |
| 2006/0257645 A1* | 11/2006 | Asaka et al. | 428/323 |
| 2010/0296175 A1 | 11/2010 | Sugasawa et al. | |
| 2012/0001520 A1* | 1/2012 | Takahashi et al. | 310/330 |
| 2014/0168504 A1* | 6/2014 | Ishida | G03B 5/00 348/357 |

FOREIGN PATENT DOCUMENTS

| | | |
|---|---|---|
| CN | 102759786 A | 10/2012 |
| JP | 04-275078 A | 9/1992 |
| JP | 09-032718 A | 2/1997 |
| JP | 09-079129 A | 3/1997 |
| JP | 09-084372 A | 3/1997 |
| JP | 2004-349180 A | 12/2004 |
| JP | 2006-311630 A | 11/2006 |
| JP | 2007-143300 A | 6/2007 |
| JP | 2010-271586 A | 12/2010 |
| JP | 2011-011549 A | 1/2011 |
| TW | 201013293 A | 4/2010 |
| WO | WO 2007/007859 A1 | 1/2007 |
| WO | WO 2011/121851 A1 | 6/2011 |

* cited by examiner (A)

(B)

DRIVE DEVICE, LENS MODULE, AND IMAGE PICKUP UNIT

CROSS REFERENCE TO RELATED APPLICATIONS

This is a U.S. National Stage Application under 35 U.S.C. §371, based on International Application No. PCT/JP2012/069679, filed Aug. 2, 2012, which claims priority to Japanese Patent Application JP2011-175616, filed Aug. 11, 2011, each of which is hereby incorporated by reference in its entirety.

TECHNICAL FIELD

The present disclosure relates to a drive device using a polymer actuator device, and a lens module and an image pickup unit that include such a drive device.

BACKGROUND ART

In recent years, high functionality of mobile electronic apparatus such as a mobile phone, a personal computer (PC), and personal digital assistant (PDA) is significantly accelerated, and mobile electronic apparatuses that have a lens module and thus have an image pickup function are common. In such mobile electronic apparatuses, focusing and zooming are performed by moving a lens in the lens module in an optical axis direction thereof.

The lens in the lens module is typically moved using, as a drive section, a voice coil motor, a stepping motor, or the like. On the other hand, recently, a predetermined actuator device used as a drive section is developed in terms of downsizing. Examples of such an actuator device may include a polymer actuator device (see Patent Literatures 1 to 3). The polymer actuator device has an ion-exchange resin film sandwiched between a pair of electrodes, for example. In the polymer actuator device, a potential difference occurs between the pair of electrodes, and the ion-exchange resin film is accordingly displaced in a direction orthogonal to a surface of the film.

CITATION LIST

Patent Literature

Patent Literature 1: Japanese Unexamined Patent Application Publication No. 2007-143300
Patent Literature 2: Japanese Unexamined Patent Application Publication No. 2011-11549
Patent Literature 3: Japanese Unexamined Patent Application Publication No. 2006-311630

SUMMARY OF INVENTION

Incidentally, such a polymer actuator device may be degraded in characteristics depending on ambient environment. Therefore, proposition of a method capable of suppressing such characteristic degradation is desired.

Therefore, it is desirable to provide a drive device, a lens module, and an image pickup unit capable of suppressing characteristic degradation according to ambient environment.

A drive device according to an embodiment of the present disclosure includes one or a plurality of polymer actuator devices each configured using an ion-exchange resin, and the ion-exchange resin contains operating ions that have activation energy equal to or smaller than a predetermined threshold.

A lens module according to an embodiment of the present disclosure includes a lens and the above-described drive device according to the embodiment of the present disclosure that drives the lens.

An image pickup unit according to an embodiment of the present disclosure includes a lens, an image pickup device configured to acquire an image pickup signal imaged by the lens, and the above-described drive device according to the embodiment of the present disclosure that drives the lens.

In the drive unit, the lens module, and the image pickup unit according to the respective embodiments of the present disclosure, the ion-exchange resin in the polymer actuator device contains the operating ions having the activation energy equal to or smaller than a predetermined threshold. Accordingly, degradation in ion conductivity in the ion-exchange resin is suppressed even in environment with low humidity, high temperature, and the like.

In the drive unit, the lens module, and the image pickup unit according to the respective embodiments of the present disclosure, the ion-exchange resin in the polymer actuator device contains the operating ions having the activation energy equal to or smaller than a predetermined threshold. Accordingly, degradation in ion conductivity is allowed to be suppressed in environment with low humidity, high temperature, and the like. As a result, characteristic degradation according to ambient environment (for example, lowering in response speed of the drive unit in low-humidity environment, and lowering in displacement of the drive unit after storage in high-temperature environment) is allowed to be suppressed.

DESCRIPTION OF EMBODIMENTS

An embodiment of the present disclosure will be described in detail below with reference to the accompanying drawings. Note that description will be given in the following order.
1. Embodiment (an example of a drive device using a polymer actuator device)
2. Modifications <Embodiment>
(Schematic Configuration of Electronic Apparatus Provided with Image Pickup Unit)

Figure 1:
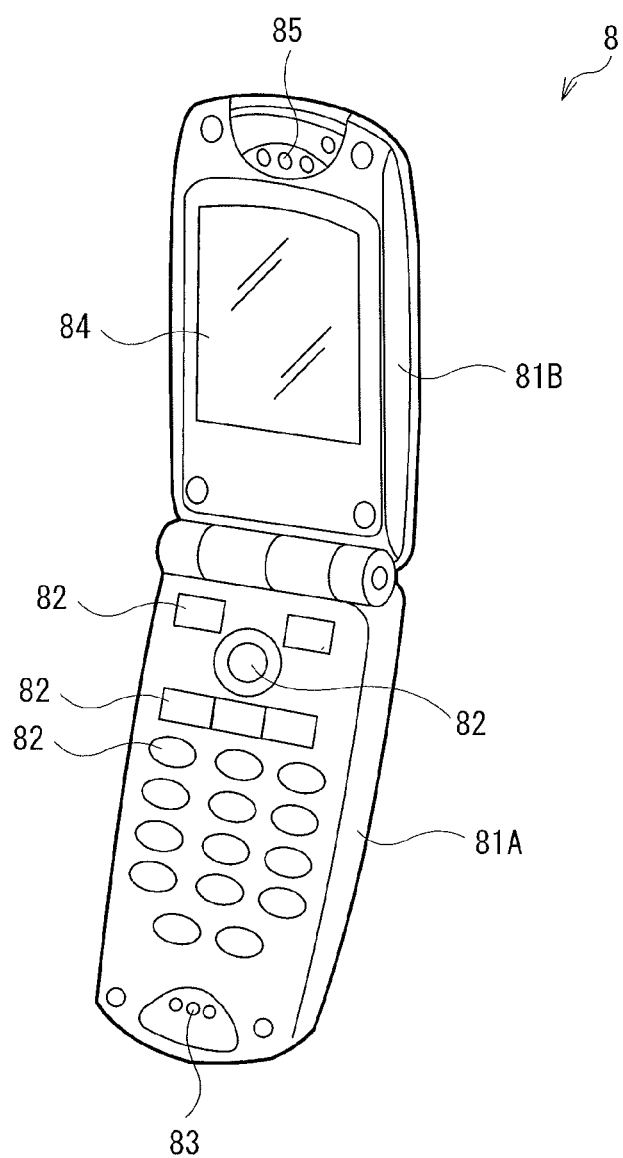
FIG. 1 is a perspective view illustrating a configuration example of an electronic apparatus provided with an image pickup unit according to an embodiment of the disclosure.
Figure 2:
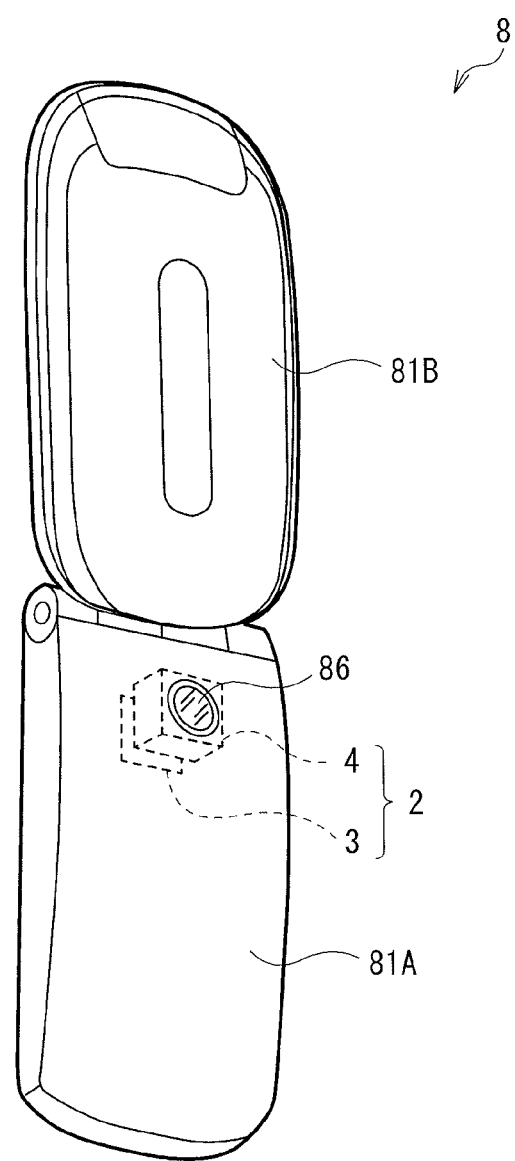
FIG. 2 is a perspective view illustrating the electronic apparatus illustrated in FIG. 1 in a different direction.

FIG. 1 and FIG. 2 are perspective views each illustrating a schematic configuration of a mobile phone (a mobile phone 8) with an image pickup function as an example of an electronic apparatus provided with an image pickup unit (an image pickup unit 2 described later) according to an embodiment of the present disclosure. The mobile phone 8 has two housings 81A and 81B that are foldably coupled with each other with a not-illustrated hinge mechanism.

As illustrated in FIG. 1, various kinds of operation keys 82 are provided on one surface of the housing 81A, and a microphone 83 is provided at the lower end of the surface. The operation keys 82 are provided to receive predetermined operation by a user to input information. The microphone 83 is provided to input voice of the user during a call and the like.

As illustrated in FIG. 1, a display section 84 using a liquid crystal display panel or the like is disposed on one surface of the housing 81B, and a speaker 85 is provided at the upper end of the surface. For example, various kinds of information such as receiving state of radio waves, battery levels, the phone number of a party on the other end of connection, contents recorded as a telephone directory (such as phone numbers and names of other parties), outgoing history, and incoming history is displayed. The speaker 85 is provided to output sounds of a party on the other end of connection during a call and the like.

As illustrated in FIG. 2, a cover glass 86 is provided on the other surface of the housing 81A, and the image pickup unit 2 is provide in the housing 81A at a position corresponding to the cover glass 86. The image pickup unit 2 is configured of a lens module 4 provided on an object side (on the cover glass 86 side) and an image pickup device 3 provided on an image side (on the inside of the housing 81A). The image pickup device 3 is a device acquiring an image pickup signal that is imaged by a lens (a lens 40 described later) in the lens module 4. The image pickup device 3 is configured of an image sensor mounted with, for example, a charge coupled device (CCD) or a complementary metal oxide semiconductor (CMOS).

(Configuration of Image Pickup Unit 2 and Lens Module 4)

Figure 3:
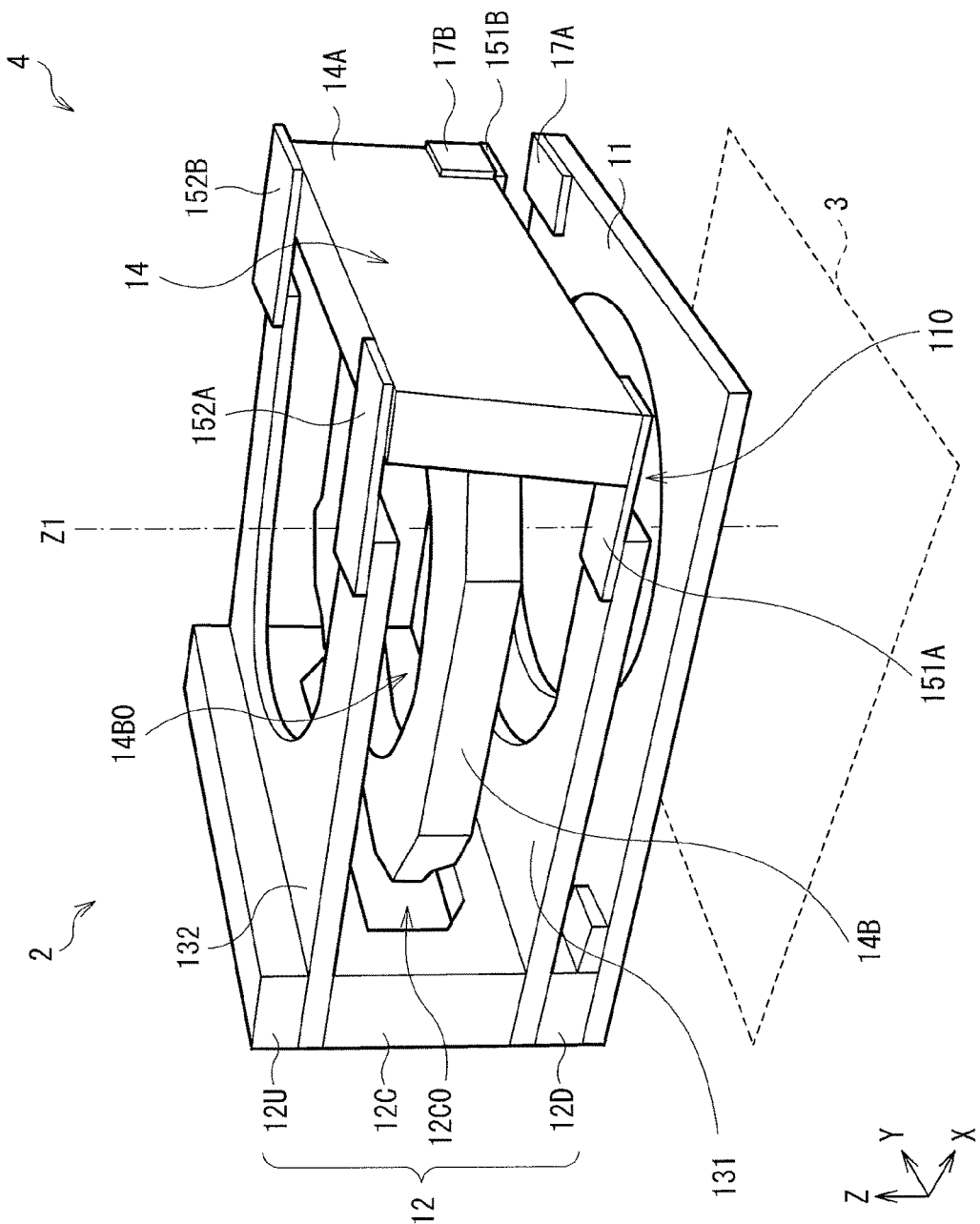
FIG. 3 is a perspective view illustrating a configuration of a main part of an image pickup unit illustrated in FIG. 2.
Figure 4:
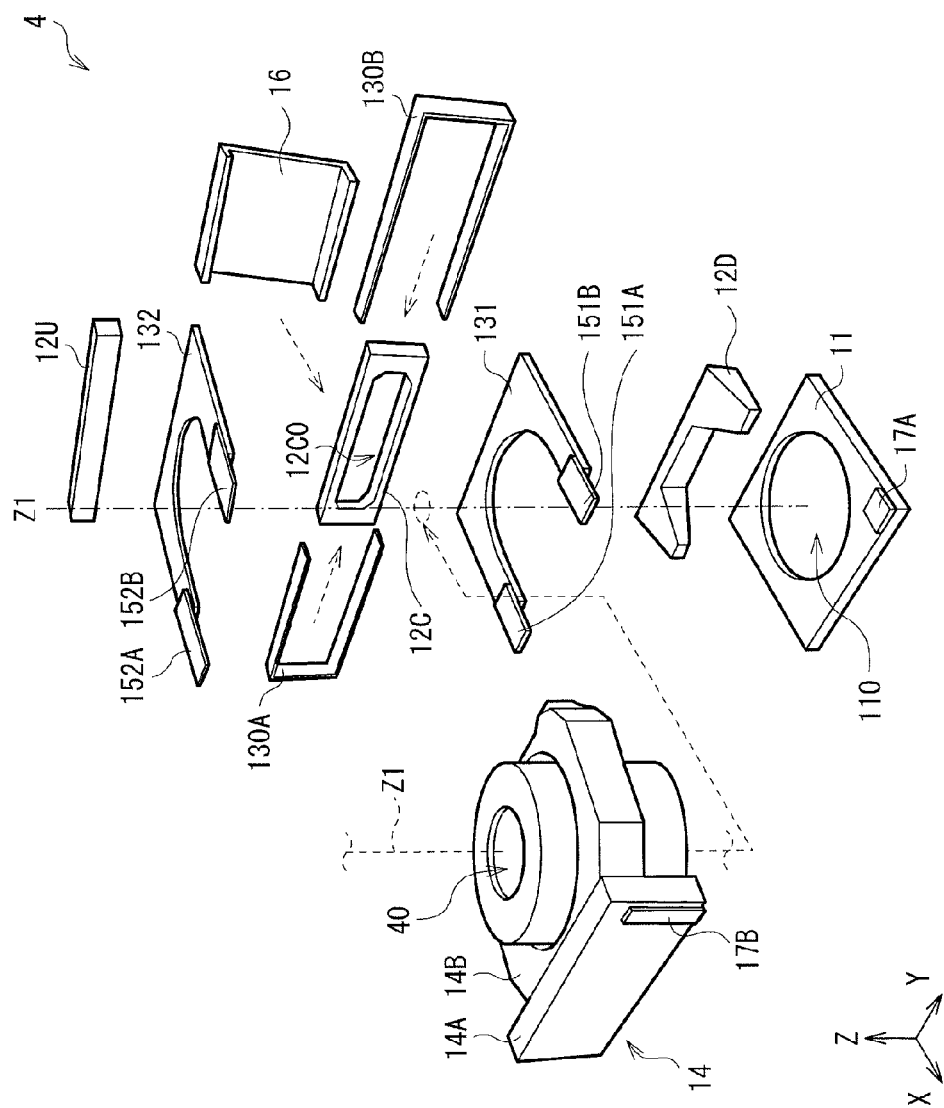
FIG. 4 is an exploded perspective view illustrating a lens module illustrated in FIG. 3.
Figure 5:
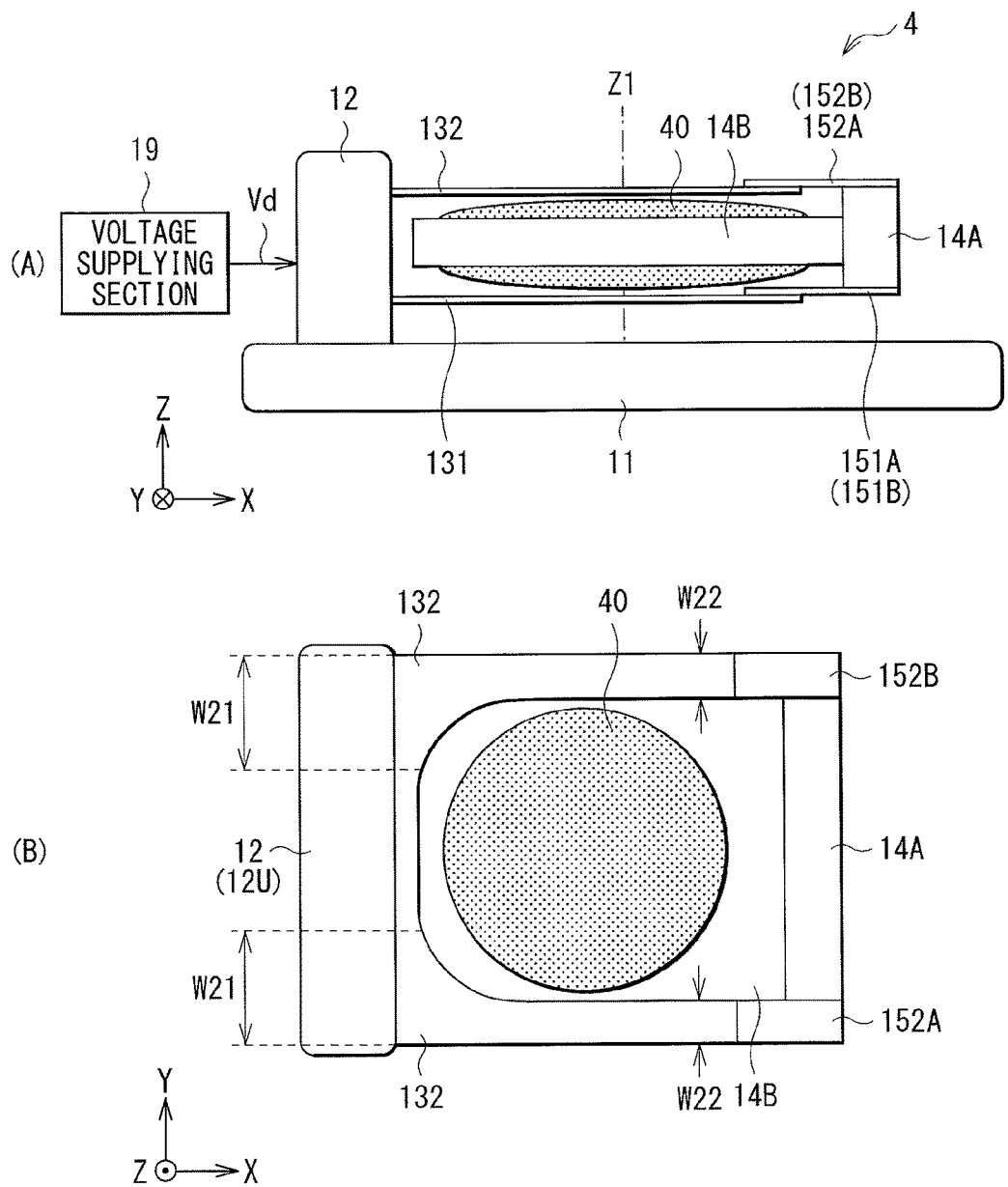
FIG. 5 is a schematic diagram illustrating a side configuration and a planar configuration of the lens module illustrated in FIG. 3.

FIG. 3 is a perspective view illustrating a configuration of a main part of the image pickup unit 2, and FIG. 4 is an exploded perspective view illustrating a configuration of the lens module 4 in the image pickup unit 2. In addition, FIG. 5 schematically illustrates a schematic configuration of the lens module 4, where (A) is a side view (Z-X side view), and (B) is a plan view (X-Y plan view).

The lens module 4 includes a supporting member 11, a polymer actuator device 131, a lens holding member 14 and the lens 40, and a polymer actuator device 132 in order from the image side (the image pickup device 3 side) to the object side along an optical axis Z1 (along a positive direction on the Z-axis). Incidentally, in FIG. 3, illustration of the lens 40 is omitted. The lens module 4 further includes a fixing member 12, coupling members 151A, 151B, 152A, and 152B, fixed electrodes 130A and 130B, a pressing member 16, and Hall devices 17A and 17B. Note that the members of the lens module 4 except for the lens 40 correspond to a specific example of "drive device (lens drive device)" in the present disclosure.

The supporting member 11 is a base member (a base) supporting the entire lens module 4, and is formed of a hard resin material such as a liquid crystal polymer.

The fixing member 12 is a member fixing one end of each of the polymer actuator devices 131 and 132, and is formed of a hard resin material such as a liquid crystal polymer. The fixing member 12 is configured of three members, namely, a lower fixing member 12D, a central (middle) fixing member 12C, and an upper fixing member 12U that are arranged from the image side (the lower side in FIG. 3 and FIG. 4) toward the object side (the upper side). One end of the polymer actuator device 131 and one end of each of the fixed electrodes 130A and 130B are sandwiched between the lower fixing member 12D and the central fixing member 12C. On the other hand, one end of the polymer actuator device 132 and the other end of each of the fixed electrodes 130A and 130B are sandwiched between the central fixing member 12C and the upper fixing electrode 12U. In addition, an opening 12C0 for partially sandwiching a part of the lens holding member 14 (a part of a holding section 14B described later) is formed in the central fixing member 12C. Accordingly, the part of the lens holding member 14 becomes movable in the opening 12C0, which makes it possible to effectively use the space and to achieve downsizing of the lens module 4.

The fixed electrodes 130A and 130B are electrodes for supplying a drive voltage Vd from voltage applying means (a voltage supplying section 19 described later) to electrode films (electrode films 52A and 52B described above) in the polymer actuator devices 131 and 132. Each of the fixed electrodes 130A and 130B is formed of gold (Au), a gold-plated metal, or the like, and is shaped like a letter "U". Therefore, the fixed electrodes 130A and 130B sandwich the central fixing member 12C (surfaces on both sides along the Z axis) from upper and lower sides, respectively, thereby applying the same voltage to the pair of polymer actuator devices 131 and 132 in parallel through a small number of wirings. In addition, in the case where the fixed electrodes 130A and 130B are each formed of a gold-plated metal, it is possible to prevent deterioration in contact resistance caused by surface oxidation or the like.

The lens holding member 14 is a member for holding the lens 40, and is formed of a hard resin material such as a liquid crystal polymer. The lens holding member 14 is disposed so that the center thereof is located on the optical axis Z1, and includes a circular holding section 14B holding the lens 40, and a connecting section 14A that holds the holding section 14B and connects the holding section 14B with the coupling members 151A, 151B, 152A, and 152B described later. Moreover, the holding section 14B is disposed between respective driving surfaces of the pair of polymer actuator devices 131 and 132.

Figure 6:
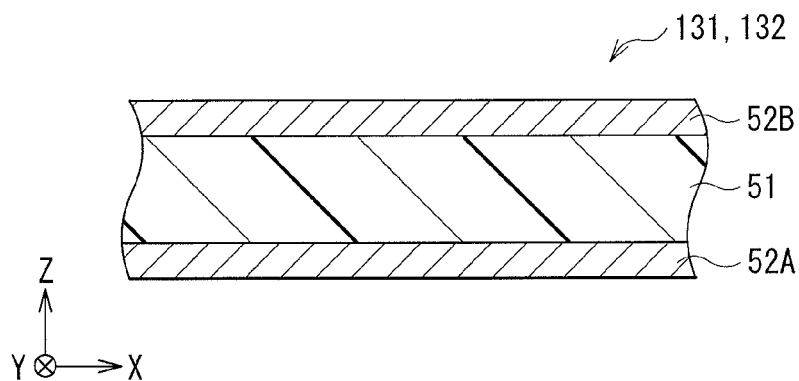
FIG. 6 is a sectional view illustrating a detailed structure of a polymer actuator device illustrated in FIG. 3.
Figure 7:
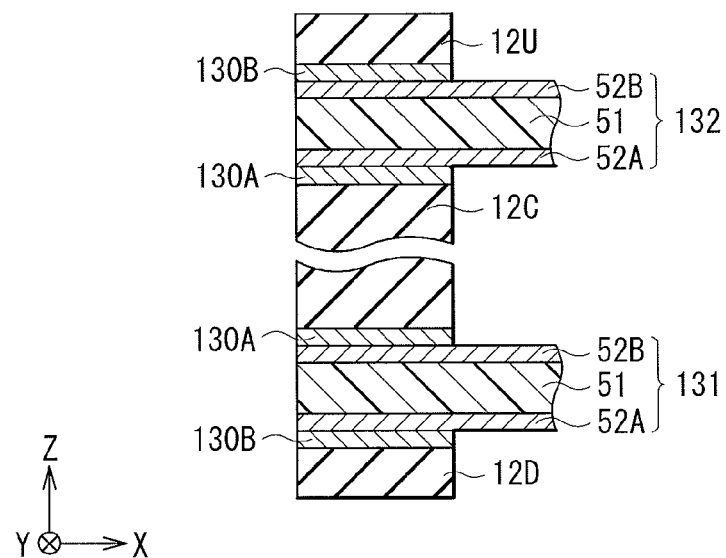
FIG. 7 is a sectional view illustrating a detailed structure of a part of each of the polymer actuator device, a fixing member, and a fixed electrode illustrated in FIG. 3.

The polymer actuator devices 131 and 132 each have the driving surface (the driving surface on the X-Y plane) orthogonal to the optical axis Z1 of the lens 40, and are disposed so that the driving surfaces face to each other along the optical axis Z1. Each of the polymer actuator devices 131 and 132 is to drive the lens holding member 14 (and the lens 40) along the optical axis Z1 through the coupling members 151A, 151B, 152A, and 152B described later. As illustrated in (B) of FIG. 5, each of the polymer actuator devices 131 and 132 has a wide part (having a width W21) on the fixing member 12 side and a narrow part (having a width W22) on a movable side (the coupling members 151A, 151B, 152A, and 152B side). The detailed structure of the polymer actuator devices 131 and 132 will be described later (FIG. 6 and FIG. 7).

Each of the coupling members 151A, 151B, 152A, and 152B is a member for coupling (connecting) the other end of each of the polymer actuator devices 131 and 132 with an end of the connecting section 14A. Specifically, each of the coupling members 151A and 151B couples the lower end of the connecting section 14A with the other end of the polymer actuator device 131, and each of the coupling members 152A and 152B couples the upper end of the connecting section 14A with the other end of the polymer actuator device 132. Each of the coupling members 151A, 151B, 152A, and 152B is formed of a flexible film such as a polyimide film, and may be desirably formed of a soft material having rigidity (flexural rigidity) equivalent to or lower than (preferably the same as or lower than) that of each of the polymer actuator devices 131 and 132. Accordingly, flexibility in which the coupling members 151A, 151B, 152A, and 152B are curved in a direction opposite to a curved direction of the polymer actuator devices 131 and 132 occurs, and a cross-sectional shape of a cantilever that is configured of the polymer actuator devices 131 and 132 and the coupling members 151A, 151B, 152A, and 152B forms an S-shaped curve. As a result, the connecting section 14A becomes parallely movable along the Z axis direction, and the holding section 14B (and the lens 40) is driven in the Z axis direction while maintaining a parallel state to the supporting member 11. Incidentally, for example, a spring constant may be used as the above-described rigidity (the flexural rigidity).

Each of the Hall devices 17A and 17B is a device used for detecting movement (displacement) of the lens holding member 14, and examples thereof may include a combination of a Hall device and a magnet.

Figure 8:
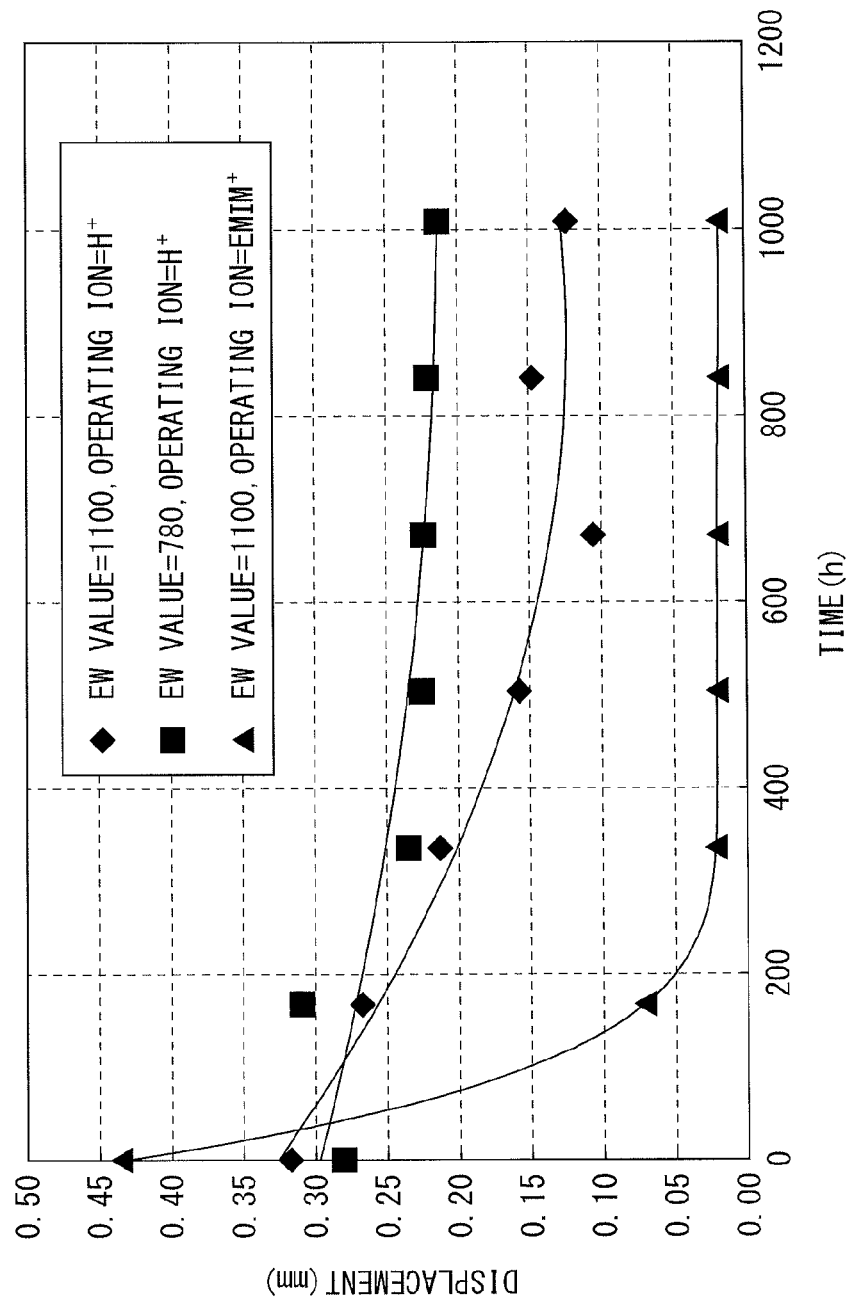
FIG. 8 is a characteristic diagram illustrating an example of relationship between a storage time and a displacement of the polymer actuator device in high-temperature environment.

As illustrated in (A) of FIG. 5, the voltage supplying section 19 supplies the drive voltage Vd to the polymer actuator devices 131 and 132 to drive (deform) the polymer actuator devices 131 and 132. Such a voltage supplying section 19 is configured of an electrical circuit using, for example, a semiconductor device. Note that the detail of the driving operation of the polymer actuator devices 131 and 132 by the voltage supplying section 19 will be described later (FIG. 8).

(Detailed Structure of Polymer Actuator Devices 131 and 132)

Next, the detailed structure of the polymer actuator devices 131 and 132 is described with reference to FIG. 6 and FIG. 7. FIG. 6 illustrates a cross-sectional structure (Z-X cross-sectional structure) of the polymer actuator devices 131 and 132.

The polymer actuator devices 131 and 132 each have a cross-sectional structure in which the pair of electrode films 52A and 52B is formed on both surfaces of an ion conductive polymer compound film 51 (hereinafter, simply referred to as a polymer compound film 51). In other words, the polymer actuator devices 131 and 132 each have the pair of electrode films 52A and 52B and the polymer compound film 51 interposed between the electrode films 52A and 52B. Note that the periphery of the polymer actuator devices 131 and 132 and the electrode films 52A and 52B may be covered with an insulating protective film formed of a highly-elastic material (such as polyurethane).

In this case, as illustrated by a sectional view (Z-X sectional view) in FIG. 7, in the polymer actuator device 131, the electrode film 52A is electrically connected to the fixed electrode 130B on the lower fixing member 12D side, and the electrode film 52B is electrically connected to the fixed electrode 130AB on the central fixing member 12C side. On the other hand, in the polymer actuator device 132, the electrode film 52A is electrically connected to the fixed electrode 130A on the central fixing member 12C side, and the electrode film 52B is electrically connected to the fixed electrode 130B on the upper fixing member 12U side. Incidentally, although not illustrated in FIG. 7, the members and electrodes from the fixed electrode 130B on the lower fixing member 12D side to the fixed electrode 130B on the upper fixing member 12U side are each sandwiched and fixed by the pressing member 16 (a flat spring) at constant pressure. Accordingly, the polymer actuator devices 131 and 132 are prevented from being broken even if being applied with large force, and stable electrical connection is possible if the polymer actuator devices 131 and 132 are deformed.

The polymer compound film 51 is curved when a predetermined potential difference occurs between the electrode films 52A and 52B. The polymer compound film 51 is impregnated with an ionic substance. The term "ionic substance" used herein indicates general ions that are capable of being transferred in the polymer compound film 51, and specifically indicates a substance containing simple hydrogen ions, simple metal ions, or cations and/or anions thereof and a polar solvent, or a liquid substance containing cations and/or anions, such as an imidazolium salt. Examples of the former may include a substance in which a polar solvent is solvated to cations and/or anions, and examples of the latter may include ionic liquid.

Examples of materials configuring the polymer compound film 51 may include a fluorine resin and an ion-exchange resin that has a hydrocarbon skeleton. As the ion-exchange resin, a cation-exchange resin is preferable in the case where a cationic substance is impregnated, and an anion-exchange resin is preferable in the case where an anionic substance is impregnated.

Examples of the cation-exchange resin may include a resin into which an acidic group such as a sulfonic acid group and a carboxyl group has been introduced. Specific examples of the cation-exchange resin may include polyethylene having an acidic group, polystyrene having an acidic group, and a fluorine resin having an acidic group. Among them, a fluorine resin having a sulfonic acid group or a carboxylic acid group is preferable as the cation-exchange resin, and examples thereof may include Nafion (manufactured by Du Pont Kabushiki Kaisha).

Types of the cationic substance impregnated to the polymer compound film 51 may be organic or inorganic without limitation. For example, various forms such as simple metal ions, a substance containing metal ions and water, and a substance containing organic cations and water are applicable as the cationic substance. Examples of the metal ions may include light metal ion such as lithium ion ($Li^+$). Moreover, examples of the organic cations may include alkylammonium ion. Further, examples of the organic cations may include cation such as hydrogen ion ($H^+$). These cations exist as hydrate in the polymer compound film 51. Therefore, when a cationic substance containing cations and water is impregnated to the polymer compound film 51, the cationic substance is preferably sealed as a whole in order to prevent water from volatilizing in the polymer actuator devices 131 and 132.

The electrode films 52A and 52B opposed to each other with the polymer compound film 51 in between each contain one or more kinds of conductive materials. The electrode films 52A and 52B may be preferably formed by conductive material powder bound by an ion conductive polymer. This is because flexibility of the electrode films 52A and 52B are enhanced. Carbon powder is preferable as the conductive material powder. This is because the carbon powder has high conductivity and a large specific surface area, and therefore a larger deformation amount is obtainable. Ketjen black is preferable as the carbon power. The material (in this case, a material containing an ion-exchange resin) similar to the material of the polymer compound film 51 described above is preferable as the ion conductive polymer.

For example, the electrode films 52A and 52B are formed as follows. Paint in which the conductive material powder and the ion conductive polymer are dispersed in a dispersion medium is applied on both surfaces of the polymer compound film 51, followed by drying. Alternatively, a film material containing the conductive material powder and the ion conductive polymer may be bonded by pressure on the both surfaces of the polymer compound film 51.

Each of the electrode films 52A and 52B may have a multilayer structure, and in such a case, may preferably have a structure in which a layer formed by binding conductive material powder by the ion conductive polymer and a metallic layer are stacked in order from the polymer compound film 51 side. This is because, with this structure, potential in in-plan direction of the electrode films 52A and 52B come close to a uniform value, and superior deformation property is obtainable. Examples of materials configuring the metallic layer may include noble metals such as gold and platinum. Although the thickness of the metallic layer is arbitrarily set, the metallic layer may be preferably a continuous film so that potential of the electrode films 52A and 52B become uniform. Examples of a method of forming the metallic layer may include plating, evaporation, and sputtering.

The size (the width and the length) of the polymer compound film 51 is allowed to be arbitrarily set depending on the size and the weight of an object to be driven (in this case, the lens holding member 43 and the like) or the displacement (the deformation amount) necessary for the polymer compound film 51. For example, the displacement of the polymer compound film 51 is set according to a desired displacement of the object to be driven (the movement along the Z axis direction).

(Detailed Configuration of Ion-Exchange Resin)

In this case, the polymer actuator devices 131 and 132 according to the present embodiment is configured using an ion-exchange resin containing ions (operating ions) that has activation energy equal to or smaller than a predetermined threshold. Specifically, such an ion-exchange resin containing the operating ions is used in one or more of the electrode films 52A and 52B and the polymer compound film 51 described above, desirably, in each (all) of the electrode films 52A and 52B and the polymer compound film 51. More specifically, in the case where each of the polymer actuator devices 131 and 132 has a three-layer structure of (the electrode film 52A formed of a mixed layer including the conductive material and the ion-exchange resin), (the polymer compound film 51 containing the ion-exchange resin), and (the electrode film 52B formed of a mixed layer including the conductive material and the ion-exchange resin), such an ion exchange resin containing the operating ions is used in one ore more of, desirably, all of the three layers.

The activation energy described above indicates energy necessary for the operating ions moving from one functional group in the ion conductive resin to the other functional group. In addition, the activation energy used herein indicates activation energy in predetermined low-humidity environment (for example, in environment with relative humidity of 30% described later). Although the detail thereof will be described later, such activation energy may be desirably equal to or lower than 0.25 [eV], and more desirably equal to or lower than 0.20 [eV], and still more desirably equal to or lower than 0.10 [eV]. In addition, although the detail thereof will also be described later, examples of the operating ions (examples of the cations here) having the activation energy of such a value may include hydrogen ion ($H^+$) and lithium ion ($Li^{30}$). Specifically, the lithium ion is an example of the operating ion having activation energy of 0.20 [eV] or lower, and the hydrogen ion is an example of the operating ion having activation energy of 0.10 [eV] or lower.

Activation energy (activation energy in ion conduction) Ea of the operating ions in the ion exchange resin is defined as follows. First, a response speed V of each of the polymer actuator devices 131 and 132 is defined by the following expression (1) using the activation energy Ea of the operating ions in the ion-exchange resin (Arrhenius law). Incidentally, in the expression (1), A is a constant (a frequency factor) independent of temperature, R is a gas constant, and T is the absolute temperature. The expression (1) is transformed by taking logarithm ($\log_e = \ln$) of both members to obtain the following expression (2). In other words, the activation energy Ea is obtained from an absolute value of a gradient of a straight line in a graph (so-called Arrhenius plot) in which the inverse of a product (RT) of the gas constant R and the absolute temperature T is represented in a lateral axis, and a logarithm (lnV) of the response speed V is represented in a vertical axis. Incidentally, as is clear from the expression (2), lnA is obtainable from an intercept of the vertical axis on the Arrhenius plot.

[Numerical Expression 1]

$$\begin{cases} V = Ae^{\frac{-Ea}{RT}} & (1) \\ lnV = -\frac{1}{RT}Ea + lnA & (2) \end{cases}$$

Note that, in the present embodiment, an ion-exchange equivalent weight (EW value) in the ion-exchange resin containing the operating ions having the activation energy described above is desirably equal to or lower than 800 [g/eq]. In such a configuration, although the detail will be described later, the response speed is prevented from being lowered at low humidity, and at the same time, displacement is effectively prevented from being lowered after long term storage at high temperature. FIG. 8 illustrates measurement results of displacement lowering of the actuator device that uses hydrogen ion as the operating ion and is preserved for 100 hours in environment with temperature of 85° C. and humidity of 50% RH, in the cases where EW value is 780 [g/eq] and 1100 [g/eq].

(Function and Effects of Image Pickup Unit 2)

Subsequently, function and effects of the image pickup unit 2 according to the present embodiment are described.

(1. Operation of Polymer Actuator Devices 131 AND 132)

Figure 9:
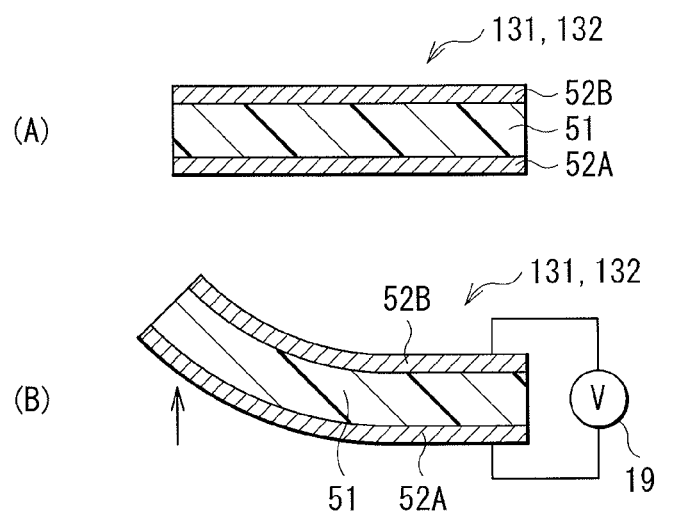
FIG. 9 is a schematic sectional view for explaining basic operation of the polymer actuator device illustrated in FIG. 3.

First, operation of the polymer actuator devices 131 and 132 is described with reference to FIG. 9. FIG. 9 is a sectional view schematically illustrating the operation of the polymer actuator devices 131 and 132. Note that the case where a substance containing cations and a polar solvent is used as a cationic substance is described as an example.

In this case, the polymer actuator devices 131 and 132 in a no-voltage applied state each have a planar shape without any curvature because the cationic substance is uniformly dispersed in the polymer compound film 51 ((A) of FIG. 9). When the voltage applied state is established (application of the drive voltage Vd is started) by the voltage supplying section 19 illustrated in (B) of FIG. 9, the polymer actuator devices 131 and 132 behave as described below. Specifically, for example, when the predetermined drive voltage Vd is applied between the electrode films 52A and 52B so that the electrode film 52A has a minus potential and the electrode film 52B has a plus potential, the cations moved to the electrode film 52A side in a state of being solvated with the polar solvent. At this time, it is difficult for anions to move in the polymer compound film 51, the electrode film 52A side of the polymer compound film 51 is swollen, and the electrode film 52B side thereof is shrunk. As a result, the polymer actuator devices 131 and 132 as a whole are curved toward the electrode film 52B side as illustrated in (B) of FIG. 9.

After that, when the potential difference between the electrode films 52A and 52B is eliminated to establish the no-voltage applied state (the application of the drive voltage Vd is stopped), the cationic substance (the cations and the polar solvent) biased on the electrode film 52A side in the polymer compound film 51 are dispersed, and the polymer actuator films 131 and 132 are returned to the state illustrated in (A) of FIG. 9.

Moreover, when the predetermined drive voltage Vd is applied between the electrode films 52A and 52B so that the electrode film 52A has a plus potential and the electrode film 52B has a minus potential from the no-voltage applied state illustrated in (A) of FIG. 9, the cations move to the electrode film 52B side in a state of being solvated with the polar solvent. In this case, in the polymer compound film 51, the electrode film 52A side is shrunk and the electrode film 52B side is swollen. As a result, the polymer actuator devices 131 and 132 as a whole are curved toward the electrode film 52A side.

(2. Operation of Lens Module 4)

Figure 10:
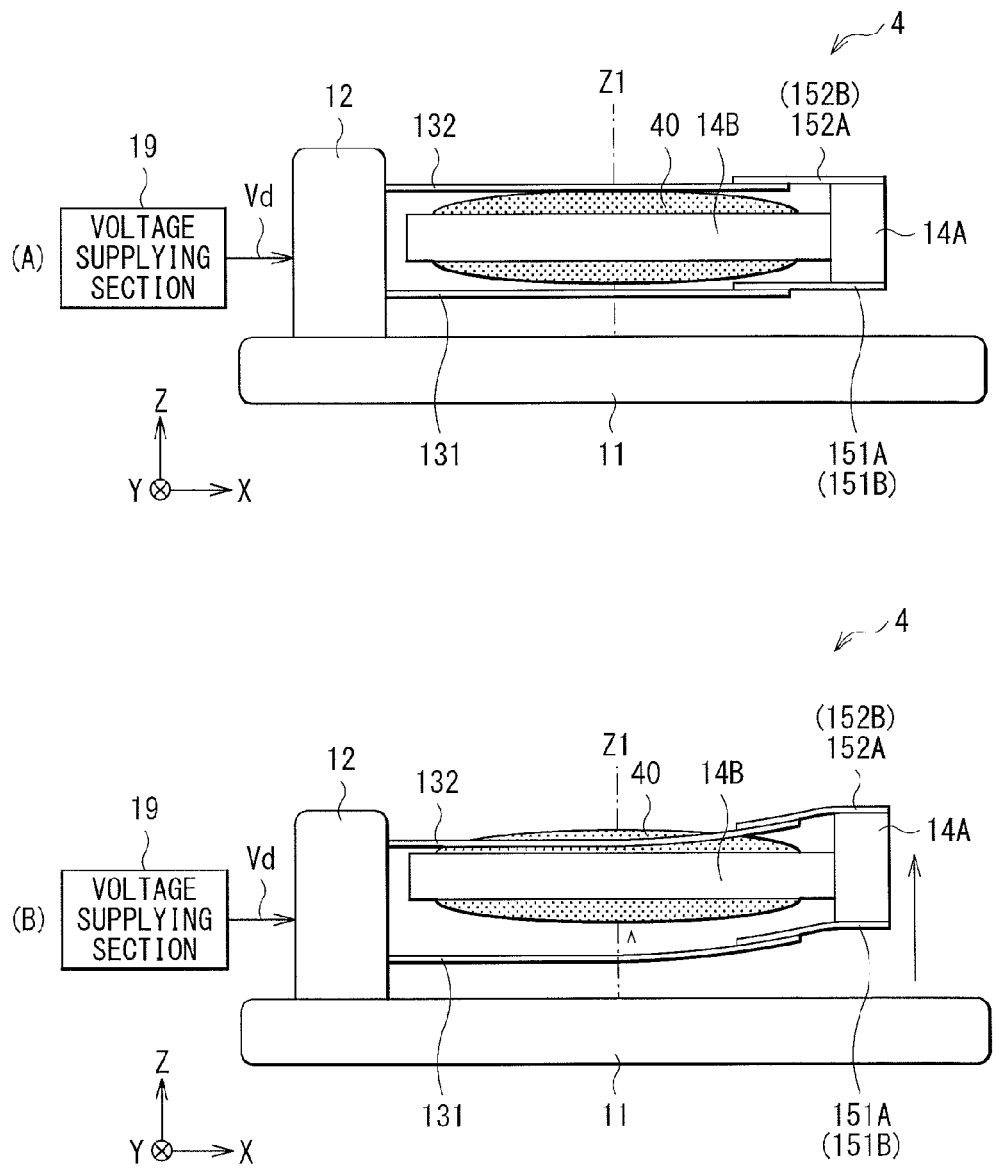
FIG. 10 is a schematic side view illustrating operation of the lens module illustrated in FIG. 3.

Subsequently, operation of the entire image pickup unit 2 (the lens module 4) is described with reference to FIG. 10. FIG. 10 is a side view (Z-X side view) illustrating the operation of the lens module 4 in the image pickup unit 2, where (A) illustrates a state before operation, and (B) illustrates a state after the operation.

As illustrated (by an arrow) in (A) and (B) of FIG. 10, in the lens module 4, the lens holding member 14 is driven by the pair of polymer actuator devices 131 and 132 to allow the lens 40 to be movable along the optical axis Z1. In the lens module 4, the lens 40 is driven along the optical axis Z1 by a drive device (a lens drive device) using the polymer actuator devices 131 and 132 in the above described manner.

(3. Function of Ion-Exchange Resin)

Incidentally, as described above, typically, the characteristics of the polymer actuator device that uses moving phenomenon of ions in the ion conductive resin (ion-exchange resin) to perform operation may be degraded depending on ambient environment.

Specific example of the characteristic degradation may include response speed lowering in the low-humidity environment (dry environment). This is caused by degradation of ion conductivity of the ion-exchange resin in low-humidity environment. As measures against the degradation, in order to prevent the ion-exchange resin from being dried, a method of laminating the entire polymer actuator device with a moisture-impermeable film, a method using the polymer actuator device in an aqueous solution, and the like are conceivable. By such methods, however, disadvantageously, operation of the polymer actuator device may be inhibited or usage environment thereof may be restricted. In addition, although a method using, as operating ions, ion liquid that is difficult to be evaporated is conceivable, the method is not enough to suppress lowering in response speed in low-humidity environment as with a Comparative Example 2 described later.

The characteristic degradation of the polymer actuator device according to the ambient environment described above includes lowering in displacement (deformation amount) after storage in high-temperature environment. This is considered as denaturation caused by dehydration reaction of a functional group in the ion-exchange resin (Shigeaki Morita and Kuniyuki Kitagawa, "Temperature-dependent structure changes in Nafion ionomer studied by PCMW 2D IR correlation spectroscopy", Journal of Molecular Structure, 974 (2010), pp. 56-59). It is known that when a functional group is denatured by the dehydration reaction, the functional group does not contribute to ion conduction. On the other hand, when the number of functional groups contributing to ion conduction is smaller than a certain amount, ion conductivity is disadvantageously degraded rapidly due to large distance between the functional groups.

Therefore, the polymer actuator devices 131 and 132 according to the present embodiment are each configured using the ion-exchange resin containing ions (operating ions) having activation energy equal to or smaller than the predetermined threshold, as described above. Specifically, such an ion-exchange resin containing the operating ions having the activation energy is used in one or more of the electrode films 52A and 52B and the polymer compound film 51, desirably, in each (all) of the electrode films 52A and 52B and the polymer compound film 51.

As a result, minimum energy necessary for ion conduction is allowed to be suppressed. Therefore, response speed equivalent to the response speed in normal humidity environment is allowed to be obtained also in low-humidity environment. In addition, even if the distance between the functional groups normally operating is increased after storage in high-temperature environment due to decreasing in number of functional groups caused by denaturation, the ion conduction is allowed to be maintained with relatively low energy. Further, in the case where the above-described ion-exchange resin having the EW value of 800 [g/eq] or less is used together, namely, in the case where an ion-exchange resin in which the amount of the functional groups per unit weight is larger than a predetermined amount is used, the following is enabled. Even if the number of functional groups denatured in high-temperature environment is increased, a certain number of functional groups normally operating are existed. Therefore, the ion conductivity is allowed to be effectively prevented from drastically degrading.

As described above, in the polymer actuator devices 131 and 132 according to the present embodiment, degradation of the ion conductivity in the ion-exchange resin is allowed to be suppressed even in the above-described environment with low humidity, high temperature, and the like. As a result, in the polymer actuator devices 131 and 132, characteristic degradation according to ambient environment (for example, as described above, lowering in response speed in low-humidity environment, and lowering in displacement after storage in high-temperature environment) is allowed to be suppressed.

(4. Examples)

Specific examples (examples 1 and 2) of such polymer actuator devices 131 and 132 are described in comparison with Comparative Examples (Comparative Examples 1 and 2).

Figure 11:
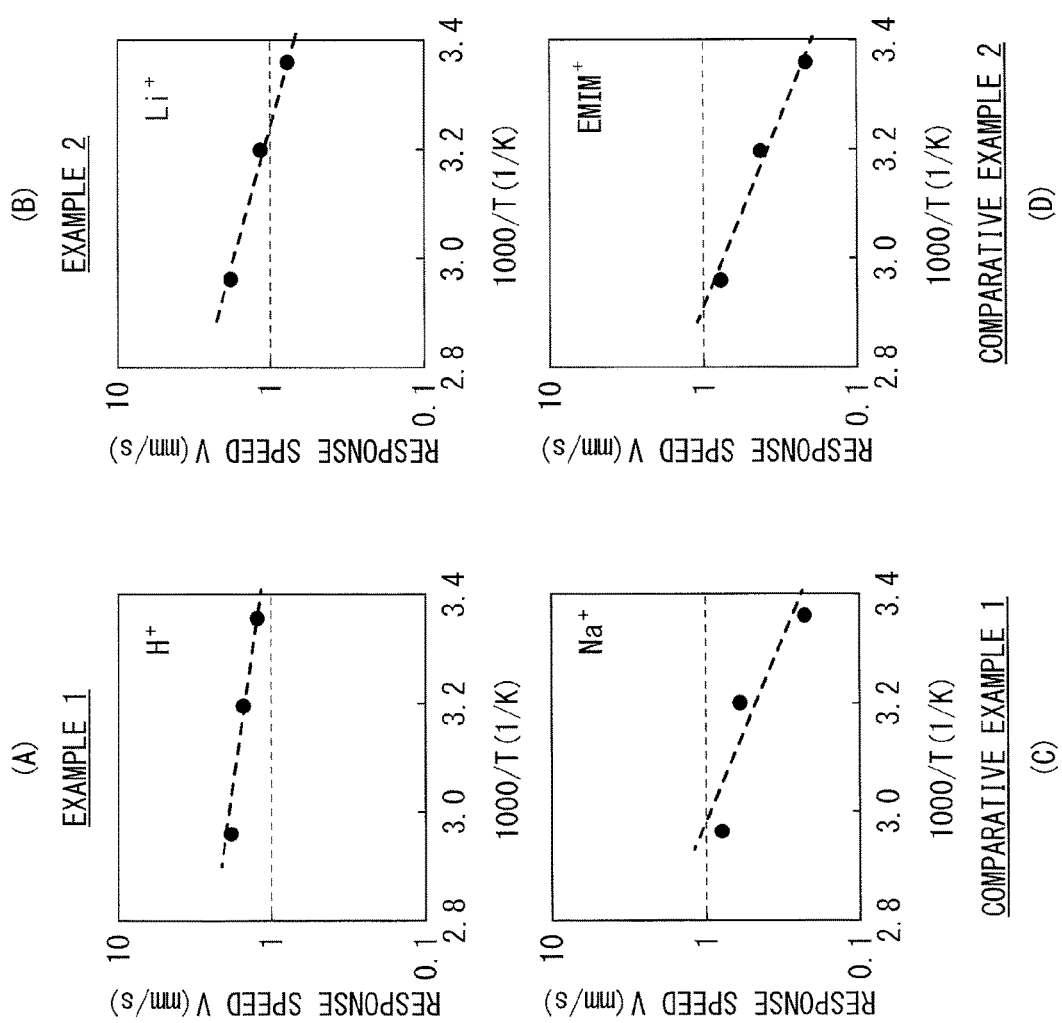
FIG. 11 is a diagram illustrating experimental results for response speed according to Examples 1 and 2 and Comparative Examples 1 and 2.

(A) to (D) of FIG. 11 illustrate experimental results of the response speed according to the Examples 1 and 2 and the Comparative Examples 1 and 2. Specifically, (A) of FIG. 11 illustrates a relationship (Arrhenius plot) between (1000/absolute temperature T) and the response speed V in the Example (the Example 1) in which hydrogen ions ($H^+$) are used as the operating ions in the ion-exchange resin of the polymer actuator devices 131 and 132. (B) of FIG. 11 illustrates Arrhenius plot in the Example (the Example 2) in which lithium ions ($Li^+$) are used as the operating ions in the ion-exchange resin. On the other hand, (C) of FIG. 11 illustrates Arrhenius plot in the Comparative Example (the Comparative Example 1) in which sodium ions ($Na^+$) are used as the operating ions in the ion-exchange resin. (D) of FIG. 11 illustrates Arrhenius plot in the Comparative Example (the Comparative Example 2) in which EMIM (1-ethyl-3-methlimidazolium) ions ($EMIM^+$) that are typical organic cations used for ion liquid are used as the operating ions in the ion-exchange resin. Note that, as the response speed V (an average response speed), a value at a front end (at a position of an effective length of 5 mm) of the polymer actuator device having a width of 2 mm and the effective length of 5 mm when a voltage of 1 V is applied to the polymer actuator device in environment with relative humidity of 30% in the air is used.

Figure 12:
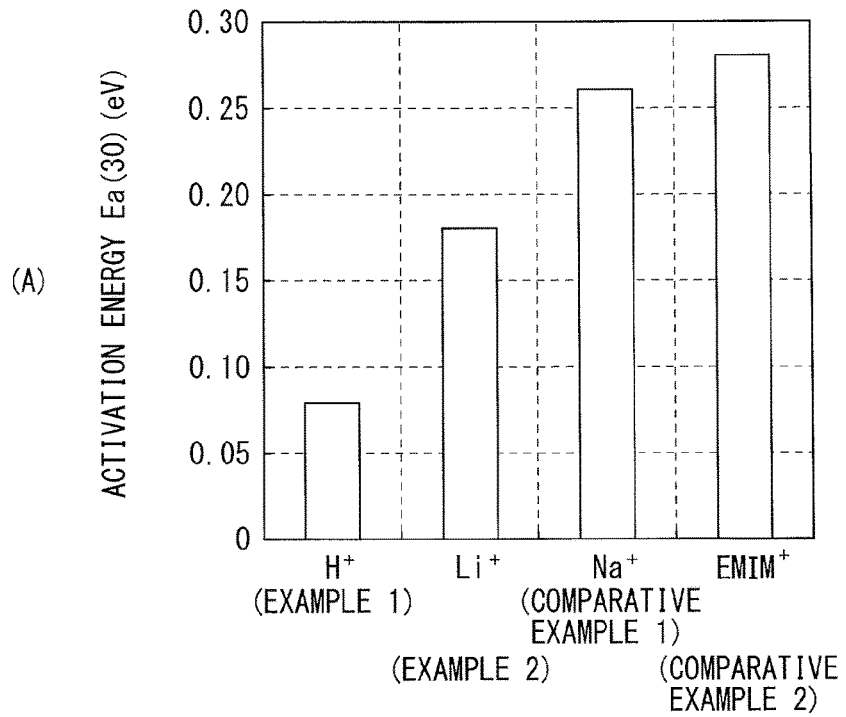
FIG. 12 is a diagram illustrating calculation results of activation energy according to the Examples 1 and 2 and the Comparative Examples 1 and 2.
Figure 12:
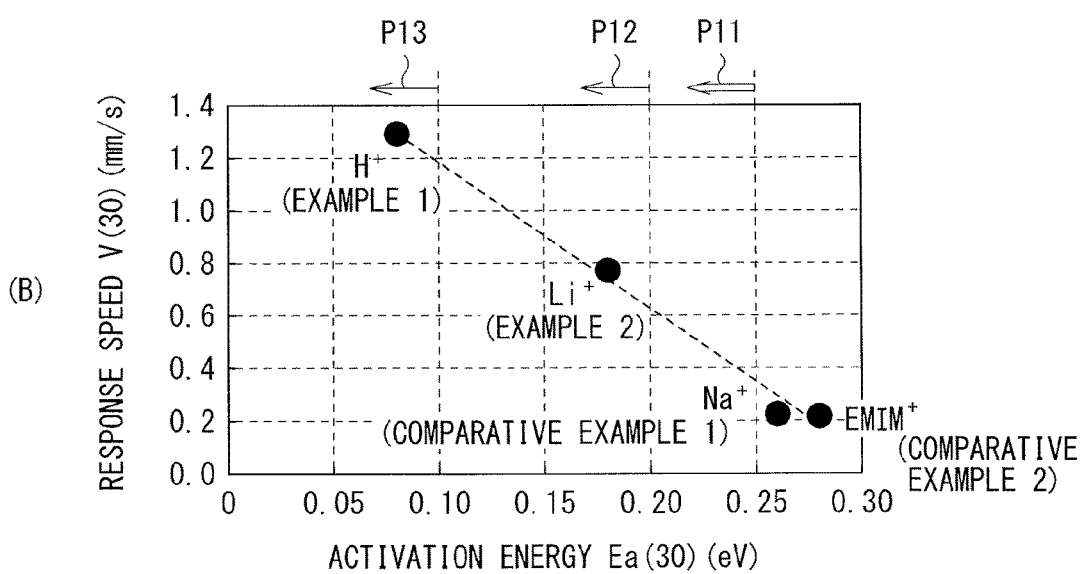

(A) of FIG. 12 illustrates activation energy Ea(30) of the operating ions in environment with relative humidity of 30% and temperature of 25° C., which is obtained from the gradient of the straight line in each Arrhenius plot illustrated in (A) to (D) of FIG. 11 with use of the above-described expressions (1) and (2). Moreover, (B) of FIG. 12 illustrates relationship between the activation energy Ea(30) in the operating ions and the response speed V(30) of each polymer actuator device in environment with relative humidity of 30% and temperature of 25° C.

It is found from (A) and (B) of FIG. 12 that the response speed V(30) of the polymer actuator device is increased as the activation energy Ea(30) of the operating ion is smaller. On the other hand, for example, for the intended use illustrated in FIG. 4, tolerable effective length and tolerable displacement of the polymer actuator device and tolerable full-stroke movement time of the lens are restricted. More specifically, in a typical image pickup device for mobile phones, the effective length of the polymer actuator device may be desirably about 5 mm in terms of the outer dimensions, and the displacement of the polymer actuator device may be desirably about 0.3 mm in terms of conditions necessary for adjustment control of a focal point. In addition, the full-stroke movement time of the lens may be desirably equal to or less than 1 second in terms of tolerable time necessary for completion of the adjustment control of a focal point. Accordingly, as the response speed of the polymer actuator device, 0.3 mm/sec or more is desired.

To satisfy the above-described condition examples, it is necessary to obtain the response speed V(30) larger than that in the Comparative Examples 1 and 2. Therefore, it is found that, as with the Examples 1 and 2, using the ion-exchange resin containing the operating ions whose activation energy Ea(30) is equal to or lower than 0.25 [eV] is effective. In addition, it is desirable in terms of improvement in response speed V(30) that hydrogen ion ($H^+$) (the Example 1) or lithium ion ($Li^+$) (the Example 2) having the activation energy Ea(30) of 0.20 [eV] or lower is used as the operating ion. Further, it is more desirable in terms of improvement in response speed V(30) that hydrogen ion ($H^+$) (the Example 1) having the activation energy Ea(30) of 0.10 [eV] or lower is used as the operating ion.

As described above, in the present embodiment, the ion-exchange resin in the polymer actuator devices 131 and 132 contains the operating ions having the activation energy equal to or smaller than the predetermined threshold. Therefore, it is possible to suppress degradation of ion conductivity in environment with low humidity, high temperature, and the like. As a result, characteristic degradation according to ambient environment (for example, lowering in response speed of the drive device in low-humidity environment, lowering in displacement of the drive device after storage in high-temperature environment) is allowed to be suppressed.

<Modifications>

As described above, although the technology of the present disclosure has been described with referring to the embodiment and the Examples, the technology is not limited thereto, and various modifications may be made.

For example, in the above-described embodiment and the like, the combination of the cationic conductive resin and the cations is mainly described as an example. However, the combination is not limited thereto. In other words, as long as the ion-exchange resin in the polymer actuator devices 131 and 132 contains the operating ions having the activation energy equal to or smaller than the predetermined threshold, it is possible to obtain effects similar to those in the above-described embodiment and the like even by a combination of an anion conductive resin and anions.

Moreover, the connecting section 14A and the coupling members 151A, 151B, 152A, and 152B described in the above-described embodiment and the like may be omitted depending on circumstances. In addition, in the above-described embodiment and the like, the case where one end of each of the polymer actuator devices 131 and 132 is directly fixed by the fixing member 12 has been described. However, the configuration is not limited thereto. Alternatively, one end of the polymer actuator device may be fixed by a fixing member indirectly (through a fixed electrode or the like).

Further, in the above-described embodiment and the like, the case where the pair of polymer actuator devices is provided has been described. However, the number of polymer actuator devices is not limited to one pair, and alternatively, one or three or more polymer actuator devices may be provided.

In addition, the shape of the polymer actuator device is not limited to that described in the above-described embodiment and the like, and the stacked structure thereof is also not limited to that described in the above-described embodiment and the like. The shape and the stacked structure of the polymer actuator device may be appropriately modified. Moreover, the shape, the material, and the like of each component in the lens module (the drive device) are not limited to those described in the above-described embodiment and the like.

Moreover, in the above-described embodiment and the like, the lens drive device driving the lens along the optical axis thereof has been described as an example of the drive device of the disclosure. However, the drive device of the disclosure is not limited thereto, and for example, the lens drive device may drive the lens along a direction orthogonal to the optical axis thereof. In addition, the drive device according to the embodiment of the disclosure is applicable to a drive device or the like that drives a diaphragm (see Japanese Unexamined Patent Application Publication No. 2008-259381), other than such a lens drive device. Furthermore, the drive device, the lens module, and the image pickup unit according to the respective embodiments of the disclosure are applicable to various electronic apparatuses in addition to the mobile phone described in the above-described embodiment and the like.

It is to be noted that the technology may be configured as follows.

(1) A drive device including one or a plurality of polymer actuator devices each configured using an ion-exchange resin, wherein the ion-exchange resin contains operating ions that have activation energy equal to or smaller than a predetermined threshold.

(2) The drive device according to (1), wherein each of the polymer actuator device includes a pair of electrode films and a polymer film interposed between the pair of electrode films, and the ion-exchange resin is used in one or more of the pair of the electrode films and the polymer film.

(3) The drive device according to (2), wherein the ion-exchange resin is used in all of the pair of the electrode films and the polymer film.

(4) The drive device according to (3), wherein the activation energy of the operating ions in the polymer film is lower than the activation energy of the operating ions in each of the electrode films.

(5) The drive device according to (3), wherein the ion-exchange resin is selectively used in the polymer film.

(6) The drive device according to any one of (1) to (5), wherein the activation energy of the operating ions is equal to or lower than 0.25 [eV].

(7) The drive device according to (6), wherein the activation energy of the operating ions is equal to or lower than 0.20 [eV].

(8) The drive device according to (7), wherein the activation energy of the operating ions is equal to or lower than 0.10 [eV].

(9) The drive device according to any one of (1) to (5), wherein the operating ion is hydrogen ion ($H^+$) or lithium ion ($Li^+$).

(10) The drive device according to any one of (1) to (9), wherein the activation energy is activation energy in a predetermined low-humidity environment.

(11) The drive device according to (10), wherein the low-humidity environment is environment with relative humidity of 30%.

(12) The drive device according to any one of (1) to (11), wherein an ion-exchange equivalent weight (EW value) of the ion-exchange resin is equal to or lower than 800 [g/eq].

(13) The drive device according to any one of (1) to (12), wherein the drive device is configured as a lens drive device driving a lens.

(14) A lens module including:
a lens; and
a drive device configured to drive the lens, wherein
the drive device includes one or a plurality of polymer actuator devices each configured using an ion-exchange resin, and
the ion-exchange resin contains operating ions that have activation energy equal to or smaller than a predetermined threshold.

(15) An image pickup unit including:
a lens;
an image pickup device configured to acquire an image pickup signal imaged by the lens; and
a drive device configured to drive the lens, wherein
the drive device includes one or a plurality of polymer actuator devices each configured using an ion-exchange resin, and
the ion-exchange resin contains operating ions that have activation energy equal to or smaller than a predetermined threshold.

This application is based on and claims the benefit of priority from Japanese Priority Patent Application JP 2011-175616 filed in the Japan Patent Office on Aug. 11, 2011, the entire contents of which are incorporated herein by reference.

The invention claimed is:

1. A drive device comprising one or a plurality of polymer actuator devices each configured using an ion-exchange resin, wherein
the ion-exchange resin contains hydrogen operating ions ($H^+$) that have activation energy equal to or smaller than 0.10 [eV].

2. The drive device according to claim 1, wherein
each of the polymer actuator device includes a pair of electrode films and a polymer film interposed between the pair of electrode films, and
the ion-exchange resin is used in one or more of the pair of the electrode films and the polymer film.

3. The drive device according to claim 2, wherein the ion-exchange resin is used in all of the pair of the electrode films and the polymer film.

4. The drive device according to claim 1, wherein the activation energy is activation energy in a predetermined low-humidity environment.

5. The drive device according to claim 4, wherein the low-humidity environment is environment with relative humidity of 30%.

6. The drive device according to claim 1, wherein an ion-exchange equivalent weight (EW value) of the ion-exchange resin is equal to or lower than 800 [g/eq].

7. The drive device according to claim 1, wherein the drive device is configured as a lens drive device driving a lens.

8. A lens module comprising:
a lens; and
a drive device configured to drive the lens, wherein
the drive device includes one or a plurality of polymer actuator devices each configured using an ion-exchange resin, and
the ion-exchange resin contains hydrogen operating ions ($H^+$) that have activation energy equal to or smaller than 0.10 [eV].

9. An image pickup unit comprising:
a lens;
an image pickup device configured to acquire an image pickup signal imaged by the lens; and
a drive device configured to drive the lens, wherein
the drive device includes one or a plurality of polymer actuator devices each configured using an ion-exchange resin, and
the ion-exchange resin contains hydrogen operating ions ($H^+$) that have activation energy equal to or smaller than 0.10 [eV].

10. The drive device according to claim 9, wherein
each of the polymer actuator device includes a pair of electrode films and a polymer film interposed between the pair of electrode films, and
the ion-exchange resin is used in one or more of the pair of the electrode films and the polymer film.

11. The drive device according to claim 10, wherein the ion-exchange resin is used in all of the pair of the electrode films and the polymer film.

12. The drive device according to claim 9, wherein the activation energy is activation energy in a predetermined low-humidity environment.

13. The drive device according to claim 12, wherein the low-humidity environment is environment with relative humidity of 30%.

14. The drive device according to claim 9 wherein an ion-exchange equivalent weight (EW value) of the ion-exchange resin is equal to or lower than 800 [g/eq].

15. The drive device according to claim 8, wherein
each of the polymer actuator device includes a pair of electrode films and a polymer film interposed between the pair of electrode films, and
the ion-exchange resin is used in one or more of the pair of the electrode films and the polymer film.

16. The drive device according to claim 15, wherein the ion-exchange resin is used in all of the pair of the electrode films and the polymer film.

17. The drive device according to claim 8, wherein the activation energy is activation energy in a predetermined low-humidity environment.

18. The drive device according to claim 17, wherein the low-humidity environment is environment with relative humidity of 30%.

19. The drive device according to claim 8, wherein an ion-exchange equivalent weight (EW value) of the ion-exchange resin is equal to or lower than 800 [g/eq].

* * * * *

UNITED STATES PATENT AND TRADEMARK OFFICE
CERTIFICATE OF CORRECTION

PATENT NO. : 9,590,169 B2  
APPLICATION NO. : 14/234841  
DATED : March 7, 2017  
INVENTOR(S) : Ishida et al.

Page 1 of 1

It is certified that error appears in the above-identified patent and that said Letters Patent is hereby corrected as shown below:

On the Title Page

Item (73) Assignee: delete "Dexterials Corporation, Tokyo (JP)" and insert -- Dexerials Corporation, Tokyo (JP) --

Signed and Sealed this  
Second Day of May, 2017

Michelle K. Lee  
*Director of the United States Patent and Trademark Office*